United States Patent [19]

Gollomp

[11] Patent Number: 4,766,595
[45] Date of Patent: Aug. 23, 1988

[54] FAULT DIAGNOSTIC SYSTEM INCORPORATING BEHAVIOR MODELS

[75] Inventor: Bernard P. Gollomp, West Lawrence, N.Y.

[73] Assignee: Allied-Signal Inc., Morris Township, Morris County, N.J.

[21] Appl. No.: 935,651

[22] Filed: Nov. 26, 1986

[51] Int. Cl.⁴ .............................................. G01R 31/28
[52] U.S. Cl. .......................................... 371/23; 371/15
[58] Field of Search ........................ 371/15, 16, 17, 18, 371/20, 23, 29; 324/73 R, 73 At; 364/200 MS File, 900 MS File

[56] References Cited

U.S. PATENT DOCUMENTS

| | | | |
|---|---|---|---|
| 4,228,537 | 10/1980 | Henckels | 371/23 |
| 4,434,489 | 2/1984 | Blyth | 371/20 X |
| 4,489,414 | 12/1984 | Titherley | 371/20 |
| 4,590,581 | 5/1986 | Widdoes | 371/20 X |
| 4,601,032 | 7/1986 | Robinson | 371/23 |
| 4,654,852 | 3/1987 | Bentley | 371/29 |
| 4,658,400 | 4/1987 | Brown | 371/20 X |

Primary Examiner—Jerry Smith
Assistant Examiner—Robert W. Beausoliel
Attorney, Agent, or Firm—Howard G. Massung

[57] ABSTRACT

A fault diagnostic system for a unit under test is disclosed which features behavior models for incorporating design knowledge of the unit under test into the system so as to implement a specification-based diagnostic approach while reducing the number of diagnostic tests. The arrangement is such that the featured diagnostic capabilities can be used with automatic test equipment or test instrumentation, and may be used to provide test programs for the automatic test equipment.

9 Claims, 3 Drawing Sheets

FAULT DIAGNOSTIC SYSTEM INCORPORATING BEHAVIOR MODELS

BACKGROUND OF THE INVENTION

Current fault detection practice for complex electronic equipment involves on-line monitoring of the equipment and has a tendency toward high false-alarm rates. In order to minimize the false-alarm rates, techniques such as duplication, error detection codes, watchdog timers, and consistency and capabilities checks are used.

To isolate a fault and to facilitate corrective action such as replacement of a defective component or adjustment of a malfunction, diagnostic procedures are applied to the equipment while the equipment is either installed in its operating environment or is removed to a repair site. The diagnostic procedures usually involve repeated measurements accomplished by applying stimuli to induce approximate operating conditions. This is followed by an evaluation of the measurements and selection of further tests until either a fault is found or proper functioning of the equipment is ascertained.

The diagnostic procedures described are usually implemented with automatic test equipment, on-line monitoring performance equipment or manually controlled test instrumentation. Automatic test equipment operation is controlled by a test program stored in a mass memory device. Manually controlled instrumentation features a printed or displayed test procedure that guides test personnel through a diagnostic or performance procedure.

Test programs and test procedures as aforenoted share common limitations such as, for example, direct testing being required for verifying performance; testing being viable only for functions whose activity levels are relatively high; and a lack of the capability for assessing and calculating a substantial set of failure symptoms.

Recently "artificial intelligence" has been applied to improve diagnostic procedures. A symptom-based approach, frequently termed "shallow reasoning" is most generally used. This approach bases the association between symptoms and faults on experience rather than on reasoned casual derivation.

The symptom-based approach is only relative to a particular unit or device, and has value where human judgement is the principal knowledge source. Hence, human technical expertise is required to develop a diagnostic procedure. Obviously, this approach is not applicable to: new equipment or equipment still under development; equipment for which knowledge of failure mechanisms and modes is unavailable; complex and functionally dense equipment; and equipment requiring automatic test equipment resources to perform testing in real time.

An alternate approach is specification-based and is frequently referred to as "deep reasoning." This approach has the advantages of artificial intelligence prominence and minimum equipment-dependent knowledge. The specification-based approach solves diagnostic problems by reasoning from the structure and functional behavior of equipment. Structure, in this sense, relates to the relationships of components in the equipment and behavior relates to the input/output behavior of each component. Thus, the composite behavior of the equipment can be derived by propragating individual component behavior via component relationships or connectivity. However, multiple possible behaviors are frequently generated, requiring extensive testing resources. Also, means for biasing behavior from failure modes or funtionally critical perspectives are not provided. Consequently, the specification-based approach requires large numbers of tests in the diagnostic procedure.

The present invention integrates the aforenoted symptom-based and specification-based approaches. The advantages of the herein disclosed integrated approach include reducing the number of diagnostic tests and acquiring and feeding back diagnostic test data to improve the quality of the diagnostic processes.

SUMMARY OF THE INVENTION

This invention contemplates a fault diagnostic system including behavior models for incorporating design knowledge of the equipment being tested so as to implement a specification-based diagnostic approach, while reducing the number of diagnostic tests, as would otherwise be the case. The test data is applied in a feedback mode to improve the fault diagnostic procedure. The arrangement is such that diagnostic capabilities may be incorporated into automatic test equipment (ATE), built-in-test equipment (BITE) and built-in-testing (BIT), and may be used to provide test programs for ATE.

The invention may be incorporated in the equipment for which it provides an automated diagnostic capability, or it may be implemented as an independent entity. When incorporated in the equipment, resources can be shared therewith in a BITE or BIT arrangement. When implemented as an independent entity (ATE) or as BITE/BIT, different physical and functional arrangements may be used to satisfy different requirements by adding or subtracting test instrumentation which may be functional components of a unit-under-test (UUT). A man-machine interface is used which may be part of the UUT, or may be a component connected to the UUT to enable user access. When the invention is configured as an independent entity (ATE) it may be implemented for a specific UUT or for a group of UUT's. Parts of the invention may be used to augment other type ATE capabilities.

DETAILED DESCRIPTION OF THE INVENTION

Figure 1:
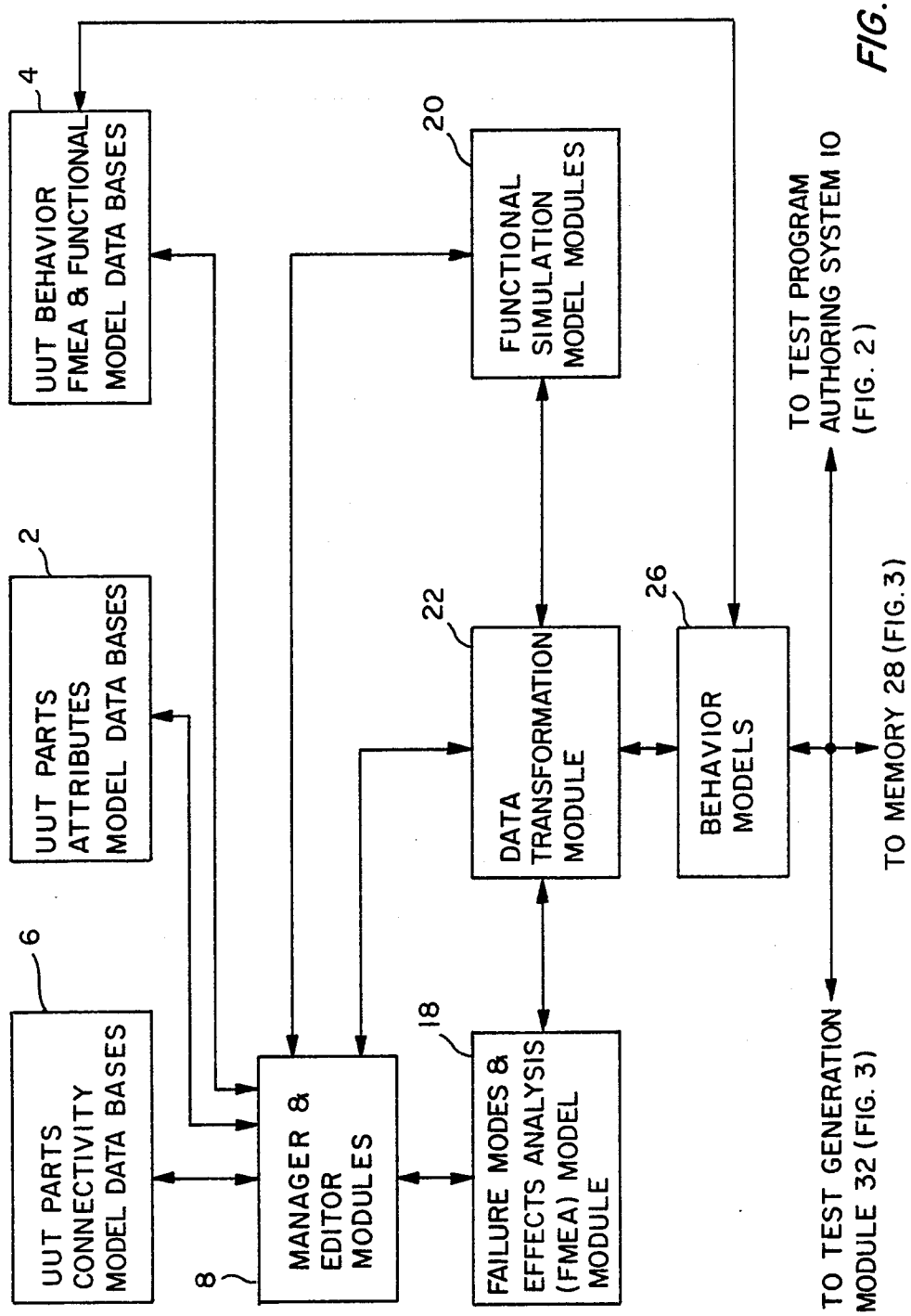
FIG. 1 is a block diagram/flow chart illustrating an arrangement for providing fault diagnostic data in accordance with the invention.

With reference to FIG. 1, the invention features data bases including unit under test parts attributes model data bases 2; unit under test behavior, failure modes and effects analysis (FMEA), and functional model data bases 4; and unit under test parts connectivity model data bases 6. Data bases 2, 4 and 6 provide data which may be applied to and from a data base management system such as ORACLE (not otherwise shown) and to and from manager and editor modules 8 using either manual entry means or with the aid of the aforenoted manager and editor modules initially entering data into the aforenoted data bases and subsequently to and from failure modes and effects analysis (FMEA) model module 18, data transformation module 22 and functional simulation model modules 20. In addition, manager and editor modules 18 provide for entry of the products of a computer-aided design (CAD) system, e.g. parts connectivity, net lists, schematics, as the case may be.

Figure 2:
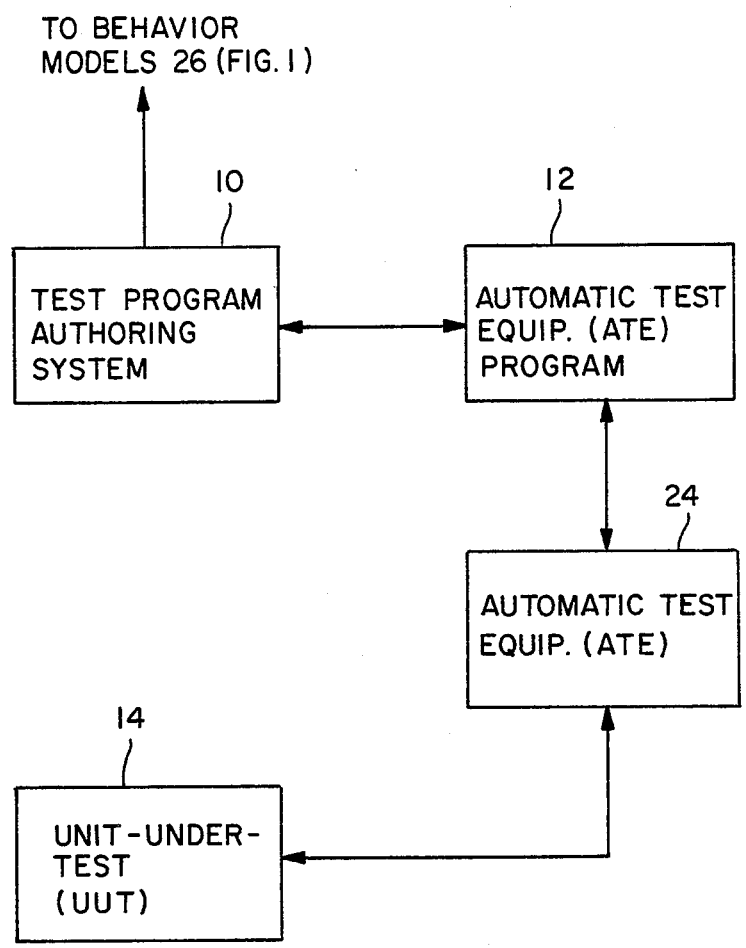
FIG. 2 is a block diagram/flow chart illustrating the use of the data provided in accordance with FIG. 1 in an automatic test equipment (ATE) mode.

With reference to FIG. 2, a test program authoring system 10 is used when the objective is to provide an automatic test equipment (ATE) test program 12. In this connection it is noted that module 12 may be a conventional program composing terminal (not otherwise shown) as is well known in the art. A unit being tested (UUT) is designated by the numeral 14 in FIG. 2.

Figure 3:
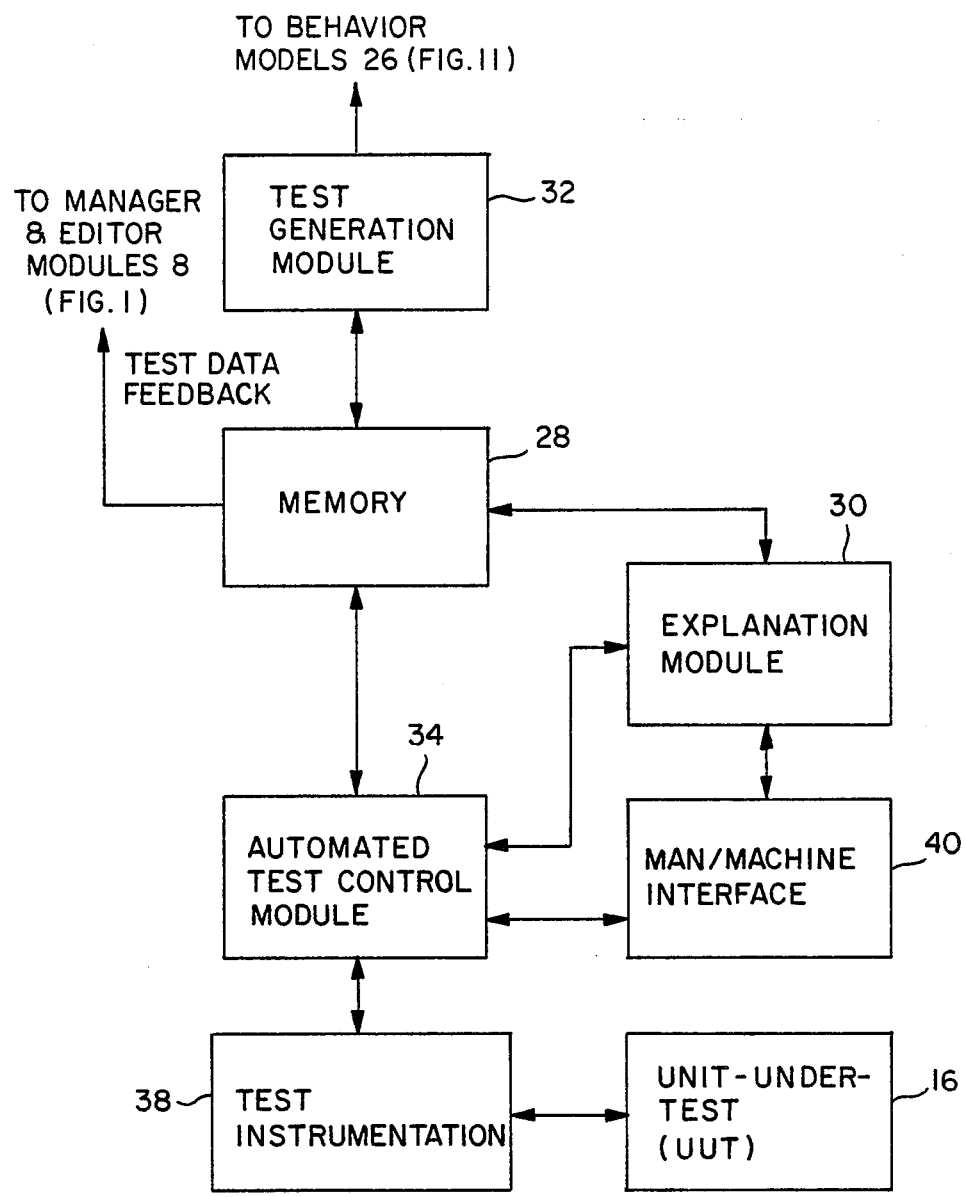
FIG. 3 is a block diagram/flow chart illustrating the use of the data provided in accordance with FIG. 1 in a test instrumentation mode.

With reference to FIG. 3, a test generation module 32 is used when the objective is to drive test instrumentation 38. A unit being tested (UUT) is designated by the numeral 16 in FIG. 3.

Data from data bases 2, 4 and 6 is applied to and from failure modes and effects analysis (FMEA) model module 18 via manager and editor modules 8. Data from data bases 2, 4 and 6 is likewise applied to and from module 22 via modules 8. Modules 8 enable transformation of the data from module 18 into the format and context required by modules 20.

In regard to FMEA module 18, the module provides means for modeling hardware from a failure modes perspective, and provides a computerized fault trace arrangement that includes considerations for stress, reliability, environment, quality and duty-cycle factors, and fault-traces every failure mode from failing components to every UUT output state. Thus, knowledge is acquired regarding the effect of component failures, their occurence probabilities and their criticalities. The capability to acquire this knowledge overcomes a major disadvantage associated with other fault diagnostic systems.

In further regard to failure mode and effects analysis (FMEA), FMEA is a well practiced failure analysis procedure and may be defined as a study of the results of effects of single independent component failures in a system. The FMEA procedure is basically a single failure at a time analysis. That is to say, each failure, as its effects are individually analyzed is considered to be the only failure in the system at that time. In this regard reference is made to Technical Memorandum BRL/TM-78-8738 entitled *FMEA—A Design Tool For the Future* prepared by Henry Ohlef, The Bendix Corporation, November, 1979.

Suffice it to say for purposes of describing the present invention that FMEA can be qualitative or quantitative. For example, an FMEA might be performed by textually describing how a permanent component failure will affect the performance of a system. By examining a drawing or a schematic diagram, a table can be constructed relating component failures to outputs. This table is called a criticality table since it relates the effects of critical parts.

Obviously some failures are more important than others. There are a number of ways that failure effects may be ordered. A manual approach assigns a figure of merit, for example, from 1 to 10, for each failure. The figure of merit weights how seriously the failure degrades UUT performance. A statistical, piece-part approach finds a failure rate for each UUT component and evaluates each component failure based on its failure rate. The fault-tracing heretofore mentioned statistically traces the effect of a failure and calculates the probability that the failure effect causes system performance degradation.

Thus, the fault-trace approach provides a statistical criticality table that orders the effects of critical components in terms of probability of occurence. A statistical criticality table provides the following information:

(1) given a component failure, UUT output failures are determined; and (2) given a UUT output failure, a component or components most likely to have caused the failure are determined.

Stated differently, the component critical path which results in a specified UUT output failure is determined.

A computer fault-tracing approach may be used for calculating UUT output state conditional probabilities. This approach relies on manual generation of behavior conditional probability data for each UUT component. This behavior conditional probability data is entered into parts model attributes data base 2 where it is stored for subsequent and repeated use. The conditional probabilities relate component inputs to component outputs. Using mathematical techniques based on the Markovian independence of components, these relationships are combined (multiplied) with the behavior of other components along the route traced until a relationship between a failing component and a UUT output state is obtained. Feedback loops are eliminated from the fault tracing along each route by a mathematical recursive relation which modifies small sets of behavior conditional probabilities to model existing steady state conditions. It is noted that no errors are introduced by this rigorous processing of feedback loop effects. It is further noted that the above described computer fault tracing approach can be accomplished by a programmer with ordinary skill in the art.

The output of FMEA model module 18 is in statistical and tabular form and is related to nodes and components in the UUT which simplifies correlation of modules 20 output data for use with the UUT. The models in modules 18 and 20 employ the same or similar nodes and components (parts) designations.

As previously indicated, module 18 receives data from data bases 2, 4 and 6 via modules 8. This data is applied to data transformation module 22 where common node and components (parts) information enables the use of module 18 data, i.e. data corresponding to failure probability and criticality, fault-trace or propagation, etc., to modify the behavior of components in modules 20. Modules 20 may include such modelling systems as DLASER, CADAT, HITS, etc., for digital equipment; and SPICE, PRECISE, etc. for analog equipment, as will now be understood by those skilled in the art.

As heretofore noted, data common to module 18 and modules 20 includes part and node designations. This commonality facilitates the use of module 18 data for directly causing simulation of part failures from the functional perspective.

Also, module 18 provides collaborative information regarding fault probabilities, propagation effects and criticality. Thus, by jointly using modules 18 and 20, both good and faulty equipment performance are economically and rigorously modeled from resource utilization and diagnostic time perspectives.

Additionally, symptoms sensed by automatic test equipment (ATE) 24 (FIG. 2) can be traced to the failing part with a high degree of certainty and, in effect, the best attributes of the symptom-based approach are merged into a specification-based approach. The resulting data which includes data that defines input and output characteristics, interface and node designations (labels for connections points), testing rank order, fault-trace information, etc., is applied to form behavioral models 26 (FIG. 1). Behavior models 26 are accessed and controlled through an associated editor module (not otherwise shown). In this connection it should be noted that modules 8 provide overall access to the several editor modules in the disclosed arrangement and to other system resources. Access for storing and retrieving information in the several model data bases 2, 4 and 6 is accomplished through manager and editor modules 8.

Behavior models 26 may, in whole or in part, reside in ATE 24 or, alternatively, may be separate therefrom. In this latter case, as shown in FIG. 3, a mass storage means or memory 28, an automated test control module 34 and test instrumentation 38 are provided. Within behavior models 26, received information is ordered and portioned for subsequent transfer to test generation module 32 and memory 28 for subsequent access and use by an explanation module 30.

When the described arrangement is used in conjunction with ATE 24, the output from behavior models 26 is passed to test program authoring system 10 where the information is used to produce ATE test programs 12 for use with ATE 24 to test UUT 14 (FIG. 2).

With particular reference to FIG. 3, module 32 provides test execution data for use by automatic test control module 34. This information transformation process essentially produces calls to routines in module 34 and to parameters to be passed to and to be used by these routines and the automated test control module. Also, in response to data from behavior models and automated test control module 34 stored in memory 28, test generation module 32 provides the identifiers and linkages needed for logical test execution and for enabling access to failure-free test, fault-diagnostic and other control data required by module 34, and to data for explanation module 30. Thus, the essentially failure-free test and the fault-trace or diagnostic strategy derived by use of FMEA module 18 and followed in the execution of the test routines and linkages to those test routines is developed.

Data from test generation module 32 may be transferred to and stored by memory 28 for future use, or transferred to automated test control module 34 for current use. Irrespective of when the data from test generation module 32 is used and applied to automatic test control module 34, this data is used by the automatic test control module to: control test instrumentation 38; evaluate and analyze all test data acquired from test instrumentation 38 that is evaluated or analyzed therein; control the order and sequence of testing in accordance with behavior models 26 requirements; facilitate access to test explanation data by explanation module 30; provide information to and enable interaction with a man/machine interface 40 (FIG. 3); and enable the collection of storage of test data for feedback from memory 28 to manager and editor modules 8 (FIGS. 1 and 3).

With the arrangement shown, automated test control module 34 (FIG. 3) incorporates or has access to all necessary facilities and features required to control ATE 24 (FIG. 2). Module 34 can depend upon what is commonly referred to as an operating system or can incorporate those features and capabilities generally incorporated in an operating system. By sharing or depending on the resources and capabilities of an operating system, ATE 24 can be part of UUT 16, for example, or can be part of a monitoring system appended to the UUT. Test instrumentation 38 can, when it incorporates processing and other required capabilities, implement the analysis and evaluation of test data that it acquires in accordance with the information and data applied to it by automatic test control module 34, and subsequently feed the resulting information back to the automatic test control module.

In general, automatic test control module 34, can either: incorporate all of the routines that are called by the output of test generation module 32 and implement those routines in accordance with the associated parameters and linkage information; can depend on routines or hardware features that may be part of test instrumentation 38, or the control hardware that may be part of automatic test control module 34, and feed back the necessary parameters and related data; or can incorporate features that would allow such routines to be stored in memory 28 and subsequently called or brought from the memory for use by module 34.

Man/machine interface 40 can incorporate display means (not otherwise shown) for providing a user with information and data regarding the state and status of ATE 24, test information, explanation of the test logic, process and diagnostic conclusions and other required and generally provided information usually associated with the ATE.

Man/machine interface 40 may be physically separable from ATE 24 or may be the display means incorporated or associated with the UUT in its usual operating state. Interface 40 could also incorporate or use man-control features, i.e. switches, keypads, touch-sensitive screens, etc. to enable access and allow control of automatic test control module 34, and for causing the display of the above indicated man/machine information and data.

Explanation module 30 can be accessed directly or through automatic test control module 34 to provide explanation of the test logic, process and diagnostic conclusions, etc. to the user. From data passed from automatic test control module 34, explanation module 30 accesses mass storage means 28, retrieves the explanation information and applies this information for display by man/machine interface 40, as the case may be.

Test instrumentation 38 may be either: the type of test instrumentation normally incorporated or associated with ATE; instrumentation that is part of or appended to the UUT and normally required during operation of such equipment; or monitoring equipment associated with the UUT.

Test data feedback provides means for acquiring the results of diagnostic testing. Such data is used in conjunction with data base 4 to assess field experience with respect to predicted experience. A departure from the behavior model would be the basis for determining a departure of the expected performance as indicated by data base 4. By using this data base in an iterative manner, the test data feedback enables corrections to be made at the required level of modeling, i.e. parts connectivity, etc. Such corrections would then be incorporated in data base 4 to provide an improved behavior model for subsequent use. Hence a self-improving diagnostics feature is incorporated into the invention.

With the above description of the invention in mind, reference is made to the claims appended hereto for a definition of the scope of the invention.

What is claimed is:

1. A fault diagnostic system for a unit under test, characterized by:
   a plurality of model data bases for modeling and providing unit under test behavior data including first model data bases for modeling and providing unit under test parts connectivity data, second model data bases for modeling and providing unit under test parts attributes data, and third model data bases for modeling and providing unit under test behavior, failure modes and effects analysis, and functional data;
   means bidirectionally connected to the plurality of model data bases for receiving the data therefrom and for converting the received data into a predetermined context and format, and for transmitting the converted data to the plurality of model data bases;
   a model bidirectionally connected to the converting means and receiving the converted data therefrom for modeling and providing failure modes and effects analysis data and for transmitting said data to the converting means;
   means bidirectionally connected to the converting means and to the failure modes and effects analysis data means and receiving the converted data and the failure modes and effects analysis data for providing modifying data, and for transmitting the modifying data to the converting means and to the failure modes and effects analysis data means; and
   means bidirectionally connected to the converting means and to the modifying data means and receiving the converted data and the modifying data for modeling both good and faulty performance of the unit under test and for providing corresponding data, and for transmitting the corresponding data to the converting means and to the modifying data means.

2. A system as described by claim 1, further characterized by:
   means bidirectionally connected to the modifying data means and to one of the plurality of model data bases for receiving the modifying data and the unit under test behavior data from the one of the model data bases for modelling and providing other unit under test behavior data, and for transmitting said other unit under test behavior data to the modifying data means and to the one of the model data bases.

3. A system as described by claim 2, further characterized by:
   means bidirectionally connected to the means for modelling and providing other unit under test behavior data for receiving said data for providing test program data, and for transmitting said test program data to the means for modelling and providing other unit under test behavior data;
   means bidirectionally connected to the test programs data means for receiving the test program data therefrom for providing an automatic test equipment program, with the test program data means being responsive to the automatic test equipment program; and
   automatic test equipment bidirectionally connected to the automatic test equipment program means and to the unit under test for providing data for testing said unit under test and for transmitting said data to the automatic test equipment means, and said unit under test responding to the testing data for transmitting data to the automatic test equipment.

4. A system as described by claim 3, further characterized by:
   means bidirectionally connected to the means for modeling and providing other unit under test behavior data for receiving said unit under test behavior data for providing test execution data, and for transmitting said test execution data to the means for modeling and providing other unit under test behavior data;
   means bidirectionally connected to the test execution data means for receiving said test execution data for providing test parameters, and for transmitting said test parameters to the test execution data means; and
   test instrumentation bidirectionally connected to the test execution data means and to the unit under test for providing data for testing said unit commensurate with said test parameters and for transmitting said data to the test execution means, and said unit under test responding to the testing data for transmitting data to the test instrumentation.

5. A system as described by claim 4, further characterized by:
   memory means bidirectionally connected to the test execution data means and to the test parameter means for receiving and storing the test execution data and for transmitting the stored data to the test execution means, and for transmitting the stored data to the test parameter means and for receiving the test parameters therefrom.

6. A system as described by claim 5, further characterized by:
   means bidirectionally connected to the test parameter means and to the memory means, and receiving the test parameters from the test parameter means and the data stored by the memory means for providing test explanation data, and transmitting the test explanation data to the test parameter means, and transmitting said test explanation data to the memory means for accessing said memory means.

7. A system as described by claim 6, further characterized by:
   man/machine interface means bidirectionally connected to the test explanation data means and to the test parameter means for interacting with the data from the test explanation means and with the test parameters from the test parameter means, and for providing first and second data commensurate with said interaction, and transmitting the first data to the test parameter means and transmitting the second data to the test explanation means.

8. A system as described by claim 7, further characterized by:
   the memory means connected to the converting means for feeding back the stored test execution data to the converting means.

9. A system as described by claim 2, wherein the one of the model data bases is characterized by:
   model data bases for modeling and providing unit under test behavior, failure modes and effects analysis, and functional data.

* * * * *